(12) United States Patent
Messinger

(10) Patent No.: US 11,276,577 B2
(45) Date of Patent: Mar. 15, 2022

(54) LONGITUDINAL SILICON INGOT SLICING APPARATUS

(71) Applicant: Samuel Messinger, Ramot Bet Shemish (IL)

(72) Inventor: Samuel Messinger, Ramot Bet Shemish (IL)

( * ) Notice: Subject to any disclaimer, the term of this patent is extended or adjusted under 35 U.S.C. 154(b) by 0 days.

(21) Appl. No.: 16/789,451

(22) Filed: Feb. 13, 2020

(65) Prior Publication Data

US 2020/0303199 A1 Sep. 24, 2020

Related U.S. Application Data

(63) Continuation-in-part of application No. 16/360,020, filed on Mar. 21, 2019, now Pat. No. 10,593,537.

(51) Int. Cl.
*H01L 21/304* (2006.01)
*B28D 5/04* (2006.01)
*H01L 21/28* (2006.01)

(52) U.S. Cl.
CPC .......... *H01L 21/304* (2013.01); *B28D 5/045* (2013.01); *H01L 21/28017* (2013.01)

(58) Field of Classification Search
CPC .......... H01L 21/461; B28D 1/08; B28D 7/02; B28D 5/042; B28D 5/045; B23D 57/007; B23D 57/003; B23D 57/0046; B23D 57/0053; B23D 57/0061; B23D 61/18; B23D 61/185
USPC ........................................... 125/16.01, 16.02
See application file for complete search history.

(56) References Cited

U.S. PATENT DOCUMENTS

| | | | | |
|---|---|---|---|---|
| 3,478,732 A | * | 11/1969 | Clark | B28D 5/045 125/12 |
| 5,006,799 A | * | 4/1991 | Pfanstiehl | G01B 7/105 324/230 |
| 5,628,301 A | * | 5/1997 | Katamachi | B23D 57/0053 125/21 |
| 5,829,424 A | | 11/1998 | Hauser | |
| 5,913,305 A | * | 6/1999 | Hauser | B23D 57/0053 125/16.01 |
| 6,107,163 A | | 8/2000 | Kojima | |
| 10,593,537 B1 | | 3/2020 | Messinger | |
| 2004/0045637 A1 | * | 3/2004 | Tanaka | B28D 5/007 148/301 |

(Continued)

*Primary Examiner* — Orlando E Aviles
*Assistant Examiner* — Robert F Neibaur

(57) ABSTRACT

The present subject matter discloses a longitudinal silicon ingot slicing apparatus for lateral slicing of cylindrical ingot to maximize resulting chips yield as compared to the conventional transverse slicing of ingot. The resulting rectangular wafers made from lateral slicing of ingot maximizes yield as by the lateral slicing of ingot, overall chips per wafer ratio gets increased as compared to transversal cutting while the said apparatus and method decreases waste due to conflict between chip and wafer geometry. The novel apparatus of longitudinal slicing of cylindrical ingot is comprising of a wire wounded around a wire reels and a plurality of grooved rollers to form a wire raw to slice the cylindrical silicon ingot. A motors are connected with the wire reels and with at least one grooved roller to slide the wire row back and forth to cut the cylindrical ingot. A work feed table is also configured along with the JIG fixture that holds the cylindrical ingot as well as align the wire raw during slicing.

6 Claims, 13 Drawing Sheets

(56) References Cited

U.S. PATENT DOCUMENTS

2007/0251516 A1* 11/2007 Nieber ............... B23D 57/0023
                                                                          125/21
2014/0311472 A1* 10/2014 Tian ....................... B24D 11/00
                                                                          125/21

* cited by examiner

LONGITUDINAL SILICON INGOT SLICING APPARATUS

CROSS-REFERENCE TO RELATED APPLICATION

This application is a continuation-in-part of Ser. No. 16/360,020, filed Mar. 21, 2019, entitled "Longitudinal Silicon Ingot Slicing Machine and Jig Fixture".

TECHNICAL FIELD

The present invention relates to the field of preparation of semiconductor wafers from a silicon ingot and maximizing overall chips per wafer. More specifically, it discloses a method of lateral slicing a silicon ingot to maximize chip production i.e. parallel to the longest axis of a cylindrical ingot for production of rectangular semiconductor wafers from a cylindrical semiconductor ingot instead of circular wafers that increases overall chips per wafer ratio and decreases waste due to conflict between chip and wafer geometry compared to circular wafers.

DESCRIPTION OF RELATED ART

Conventionally, the silicon wafers which are used in fabrication of silicon chips are made by slicing circular wafers from cylindrical, purified silicon ingots, where ingots are sliced perpendicular to longitudinal axis of the silicon ingot resulting in a silicon wafers circular in shape. But, the resulting circular wafers made from the conventional method has number of drawbacks such as waste of space due to conflict in geometry of fabricated chips on wafer and geometry of wafer itself. Since, the chips are square in shape while wafers are circular in shape, there is lot of wasted space on each of wafers due to a conflict with geometry. Other factors in addition to the waste due to geometry conflict are waste due to inclusions and edge exclusion and polishing that further reduces the available wafer space for usable chips.

One such apparatus and method of slicing silicon ingot into circular wafers is disclosed in U.S. Pat. No. 6,065,462A which teaches about apparatus and method for slicing a work piece, in particularly, a polysilicon or single crystal silicon ingot, utilizing a closed loop of diamond impregnated wire in which the work piece (or ingot) is rotated about its longitudinal axis as the diamond wire is driven orthogonally to it and advanced from a position adjoining the outer diameter of the ingot towards its inner diameter making circular wafers from the ingot.

Further, U.S. Pat. No. 5,829,424A discloses a device for sawing by a wire comprising a sawing region in which a piece to be sawed bears against the wire adapted to be displaced by reciprocating or continuous movement to saw the piece and a device for directing the wire comprising a payout spool supplying new wire to the sawing zone and a take-up spool collecting the used wire from the sawing zone. Hence, this invention discloses the device that slices silicon ingot into circular wafers using wires embedded with diamond dust.

Therefore, there exists a need of a method and system that can maximize the overall chips per wafer fabricated from silicon ingot. Further, there is a need of a system and method of fabrication of semiconductor chips from silicon ingot by slicing rectangular wafers lengthwise from the ingot to minimize waste of space due to conflict in geometry of chips and wafer in addition to waste due to edge exclusion and polishing. Moreover, there is a need of a system and method that reduces inclusion or defects in the ingot wafer slices.

SUMMARY

This summary is provided to introduce a selection of concepts in a simplified form that are further disclosed in the detailed description of the invention. This summary is not intended to identify key or essential inventive concepts of the claimed subject matter, nor is it intended for determining the scope of the claimed subject matter.

The subject matter disclosed herein address the above-mentioned need of a method and a system for fabrication of semiconductor wafers by slicing the silicon ingots on its side to produce rectangular wafers which results in area gain and hence gain in number of chips per wafer, minimizes waste due to conflict between geometry of chips and ingots as conventional method teaches about slicing of silicon ingot forming round wafers while the fabricated chips on wafers are square in geometry that causes conflict in geometry hence lot of wasted space. While, the present disclosure teaches about slicing of conventional silicon ingot lengthwise to fabricate wafers rectangular in geometry and as the chips are square in geometry, there is no conflict in geometry that in turns minimizes waste due to geometry as well as waste due to edge exclusion and polishing which further reduces the available wafer space for usable chips.

The method disclosed herein teaches about the advantages of lateral slicing of silicon ingot to fabricate rectangular silicon wafers over conventional slicing of ingot to fabricate round wafers. Further, the present invention teaches about the process and method of lateral slicing of the silicon ingot such as the silicon ingots grown by the Czochralski pulling method (or any other method which produces cylindrical ingots) which are cylindrical in geometry that makes idea of slicing of silicon ingot in lateral direction or longitudinally using diamond embedded wire, non-obvious for the person of relevant art. Slicing of round surface of cylindrical ingot longitudinally into thin silicon wafers using system of plurality of parallel diamond embedded wires without sliding of wires on the surface of the ingot is work which is not obvious. Hence, this invention discloses a method for slicing of silicon ingot in longitudinal direction using the system or apparatus of multiple parallel diamond embedded wires.

The method of lateral slicing of silicon ingot to fabricate rectangular silicon wafers maximizes the chip yield due to the fact that the change in direction of cutting of silicon ingot to longitudinal increases the area by 1.95 times than conventional transverse cutting of ingot in round silicon wafers hence increases number of die per wafer.

Now, using the present method and mathematics, hereby it would be proved that the longitudinal slicing increase area of wafers and hence results in 14% increment in chips per wafer. Let's consider a conventional cylindrical ingot having radius (R) and Length (L), if we slice the cylindrical ingot horizontally using traditional slicing methods, resulting wafers would be circular in geometry with diameter of 2 R.

Area of resulting circular wafer=$\pi R^2$

Number of Wafers possible=Length of Ingot $(L)$/Thickness of Wafer $(t)$ $n(\text{wafer\_circular})=L/t$ Now, considering longitudinal Slicing of same ingot, Number of possible wafers will be defined by the diameter of the ingot.

N(wafer_longitudinal)=Diameter of Ingot/Thickness of wafer

Hence, $N=2R/t$

Area of Longitudinal Wafer=Length of Ingot*$Xn$

Where X is half width of a longitudinal slice
And n is a number between 1 and R/t
Where, $$Xn = 2 * \sqrt[2]{(Rw^2 - n^2t^2)}$$

Now, to find area of single longitudinal cut is given by, $$A \text{ (longitudinal)} = L \text{ (ingot)} * Xn$$
$$= L \text{ (ingot)} * 2 * \sqrt[2]{(Rw^2 - n^2t^2)}$$

Hence, Total Area=

$$2 * \sum_{n=1}^{R/t} L(\text{ingot}) * 2 * \sqrt[2]{(Rw^2 - n^2t^2)}$$

Now, comparing to Horizontal Cuts, $$\frac{\text{Total Area in Longitudinal Cut}}{\text{Total Area in Horizontal Cut}} = \frac{4 * L \text{ (ingot)} * \sum_{n=1}^{R/t} \sqrt[2]{(Rw^2 - n^2t^2)}}{n(\text{wafer}_{circular}) * \pi * R^2(\text{wafer})}$$

So, the ratio of Area $\lambda$ is given by, $$\frac{4 * \sum_{n=1}^{R/t} \sqrt[2]{(Rw^2 - n^2t^2)}}{\pi * Rw^2}$$

Thus, required feasibility $\lambda > 1.25$
Thus, due to increase in the area of silicon wafers by longitudinal slicing instead of horizontal/transverse slicing, the chip yield increases by 14% that means 14% more chips gets fabricated by longitudinal slicing.

According to an embodiment, the method of present invention uses novel wire machines apparatus having plurality of diamond embedded wire mechanism for longitudinal slicing of ingot. The system of present embodiment further comprises a novel JIG that makes longitudinal slicing of silicon ingot possible. The JIG of present embodiment comprises of plurality of parallel bars between which diamond dust embedded wires gets located and which behaves as a guide for diamond embedded wires during the slicing of ingot. Also, this JIG mechanism protects and holds the wires from sliding down and miss the designated location of slicing during the process as the slicing of cylindrical ingot is being done longitudinally. Further, the parallel bars of the JIG mechanism are made such a way that the slurry and debris from the slicing automatically gets released.

BRIEF DESCRIPTION OF DRAWINGS

The foregoing summary, as well as the following detailed description of the invention, is better understood when read in conjunction with the appended drawings. For the purpose of illustrating the invention, exemplary constructions of the invention are shown in the drawings. However, the invention is not limited to the specific methods and structures disclosed herein. The description of a method step or a structure referenced by a numeral in a drawing is applicable to the description of that method step or structure shown by that same numeral in any subsequent drawing herein.

DETAILED DESCRIPTION OF INVENTION

The embodiment herein and the various features and advantageous details thereof are explained more fully with reference to the non-limiting embodiments and detailed in the following description. Descriptions of well-known components and processing techniques are omitted so as to not unnecessarily obscure the embodiments herein. The examples used herein are intended merely to facilitate an understanding of ways in which the method and embodiments herein may be practiced and to further enable those of skill in the art to practice the embodiments herein. Accordingly, the examples should not be construed as limiting the scope of the embodiments herein.

According to an embodiment, the present invention discloses a novel method of longitudinal slicing of silicon ingot to maximize the chip yield where the longitudinal slicing refers to the longitudinal cutting of cylindrical silicon ingot along its longitudinal axis using any of the cutting apparatus of silicon ingot. Further, the method disclosed herein teaches about advantages of lateral slicing of silicon ingot over conventional transverse slicing of silicon ingot. According to the present invention, the method and system for lateral slicing of cylindrical silicon ingot comprises of a conventional diamond embedded wire saw or wire slicing system with novel slicing arrangement for longitudinal slicing of ingot without sliding or misplacement of wires during slicing operation where the ingot to fabricate wafer is configured longitudinally to the running direction of wires. The method and system of present invention uses a JIG fixed over the silicon ingot using JIG fixtures where the said JIG further comprises plurality of parallel rods to locate and guide parallel diamond embedded wires between parallel rods of JIG and also to hold the wires from sliding down and miss the designated location of slicing. One another embodiment of present invention uses a conventional circular metal blade saw for cutting silicon ingot longitudinally with novel slicing arrangement and method of present invention. Further, according to one another embodiment, the slicing of cylindrical silicon ingot is done at an angle, not perpendicular to axis of the cylindrical ingot.

Figure 1A:
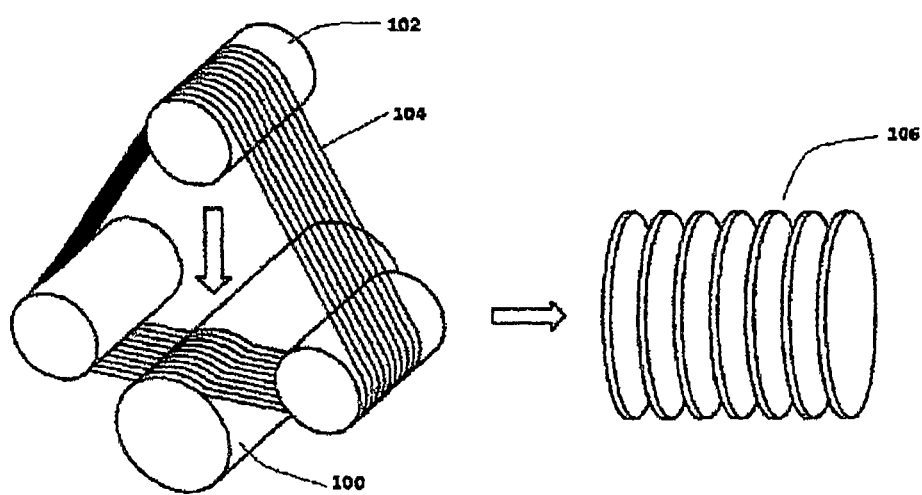
FIG. 1A illustrates diagram of traditional slicing arrangement for transversal slicing of circular wafers.
Figure 1B:
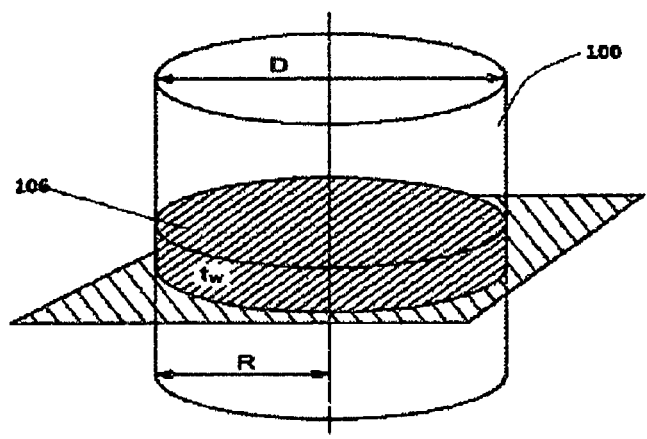
FIG. 1B discloses Slicing geometry for a silicon ingot in conventional transversal slicing.
Figure 1C:
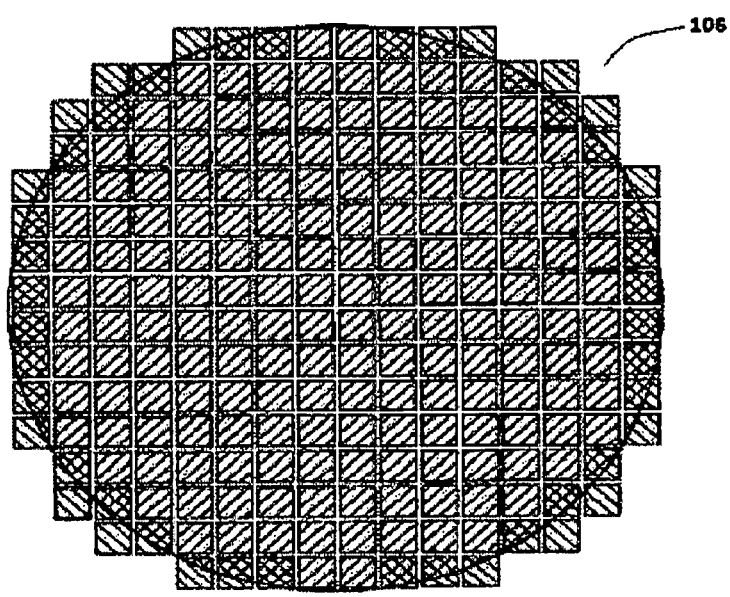
FIG. 1C shows loss of chips due to conflict in geometry of chips and round wafer in conventional transversal slicing.

Now referring to FIG. 1A and FIG. 1B which respectively illustrates diagram of traditional slicing arrangement for transversal slicing of circular wafers and Slicing geometry for a silicon ingot in conventional transversal slicing. In FIG. 1A, the conventional system for slicing of silicon ingot 100 with a parallel diamond embedded wire 104 raw which are wound around three grooved rollers 104. The silicon ingot 100 is configured transversely that as a result, fabricates round silicon wafers 106. FIG. 1C illustrates the resulting round wafer fabricated from transversal slicing of silicon ingot and chips lost in conventional slicing due to conflict in geometry of chips which are square with geometry of wafer which is circular. In addition to loss due to conflict in geometry, there are other losses and disadvantages in conventional slicing such as loss due to edge exclusion and polishing that further reduces the available wafer space for usable chips.

Figure 2A:
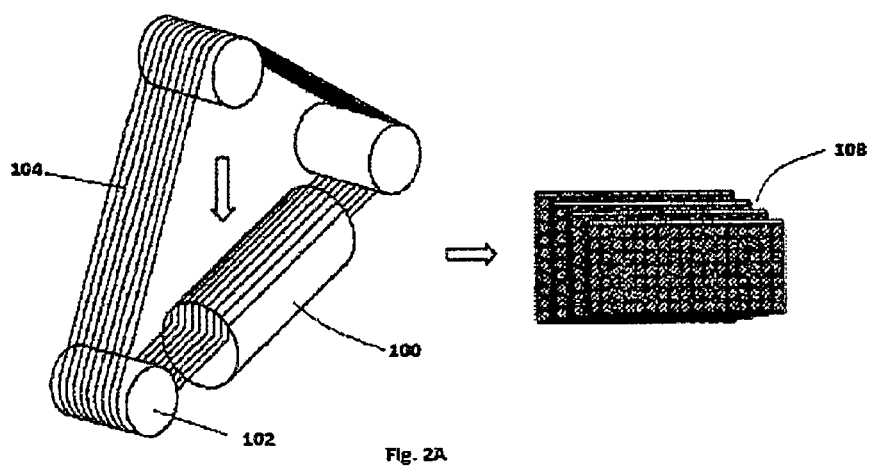
FIG. 2A exemplarily illustrates one embodiment of novel slicing arrangement for longitudinal slicing of silicon ingots for fabrication of rectangular wafers and to maximize chip yield.

FIG. 2A discloses one embodiment of novel slicing arrangement for lateral slicing of silicon ingots 100 for fabrication of rectangular wafers 108 and maximize chip yield. While, FIG. 2B exemplarily illustrates view of novel slicing of the ingot longitudinally. Here, the system for slicing of ingot is also same as the system for slicing in FIG. 1A having plurality of parallel diamond embedded wire 104 wound around three grooved rollers 104 for continuous and parallel running of diamond embedded wires but with a method of novel arrangement of silicon ingot 100 laterally that makes the present invention non-obvious for the person skilled in the art. The diagonal slicing of silicon ingot is being done using method of present invention that makes possible parallel slicing of curvy surface of silicon ingot using system with plurality of diamond embedded wires or circular blade saw without sliding or misplacement of wires or ingot while slicing or cutting due to surface of silicon ingot.

Figure 2B:
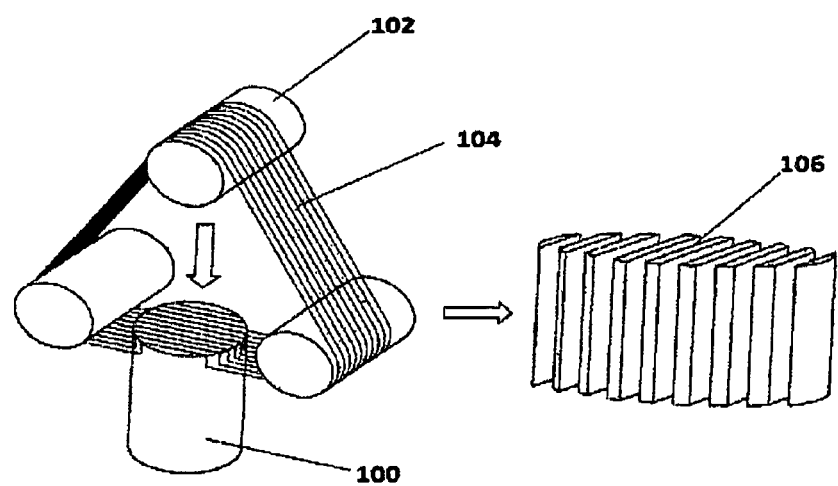
FIG. 2B exemplarily illustrates one another embodiment of novel slicing arrangement for longitudinal slicing of silicon ingot for fabrication of rectangular wafers and to maximize chip yield.
Figure 2C:
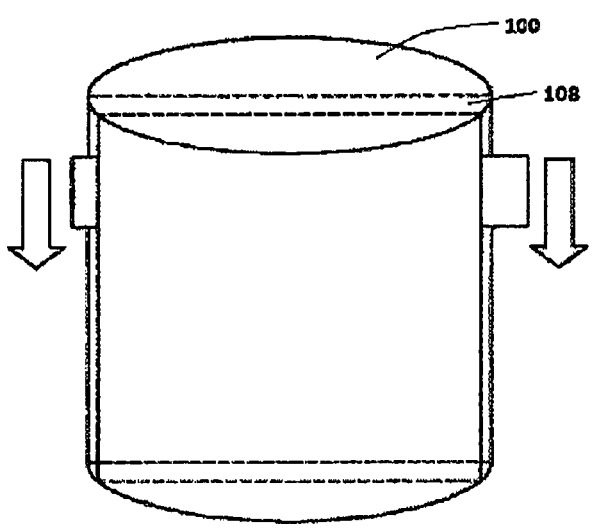
FIG. 2C exemplarily illustrates view of novel slicing of the ingot longitudinally.

Referring to FIG. 2C, it illustrates one another exemplary embodiment for novel slicing of silicon ingot longitudinally from end of cylindrical ingot where JIG (not shown) to hold and guide diamond embedded wires of slicing apparatus is configured at the end of the cylindrical silicon ingot using JIG fixture. While FIG. 3D of present embodiment discloses diameter and other parameters of single slice in longitudinal slicing according to present embodiment of method and invention.

Method of longitudinal slicing of silicon ingot to fabricate rectangular wafer increases effective area and hence chip yield by 14% compared to conventional transverse or horizontal slicing which is hereafter proved using mathematical formulas and dimensions shown in drawings. Let's consider a conventional cylindrical ingot having radius (R) and Length (L) shown in FIG. 1B, if we slice the cylindrical ingot horizontally using traditional slicing methods, resulting wafers would be circular in geometry with diameter of 2 R.

Area of resulting circular wafer=$\pi R^2$

Number of Wafers possible=Length of Ingot ($L$)/Thickness of Wafer ($t$)

$n(\text{wafer\_circular}) = L/t$

Now, considering longitudinal Slicing of same ingot as shown in FIG. 2A and FIG. 2B, Number of possible wafers will be defined by the diameter of the ingot.

$N(\text{wafer\_longitudinal})$=Diameter of Ingot/Thickness of wafer

Hence, $N = 2R/t$

Figure 2D:
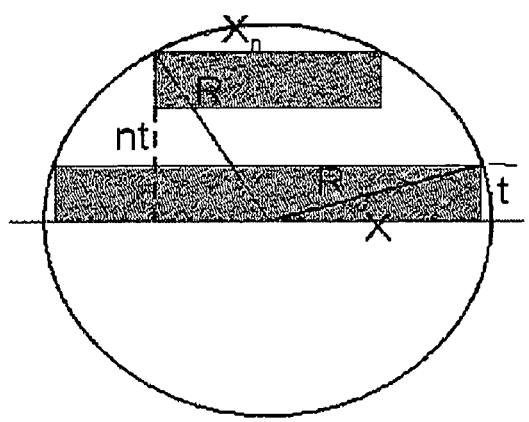
FIG. 2D illustrates width and other parameters of single slice in longitudinal slicing according to present method of invention.

Area of Longitudinal Wafer=Length of Ingot*$Xn$

Where X is half width of a longitudinal slice that is shown in FIG. 2D

And n is a number between 1 and R/t

Where, $$Xn = 2 * \sqrt[2]{(Rw^2 - n^2 t^2)}$$

Now, to find area of single longitudinal cut is given by, $$A \text{ (longitudinal)} = L \text{ (ingot)} * Xn$$

$$= L \text{ (ingot)} * 2 * \sqrt[2]{(Rw^2 - n^2 t^2)}$$

Hence, $$\text{Total Area} = 2 * \sum_{n=1}^{R/t} L(\text{ingot}) * 2 * \sqrt[2]{(Rw^2 - n^2 t^2)}$$

Now, comparing to Horizontal Cuts, $$\frac{\text{Total Area in Longitudinal Cut}}{\text{Total Area in Horizontal Cut}} = \frac{4 * L(\text{ingot}) * \sum_{n=1}^{R/t} \sqrt[2]{(Rw^2 - n^2 t^2)}}{n(\text{wafer}_{circular}) * \pi * R^2(\text{wafer})}$$

So, the ratio of Area $\lambda$ is given by, $$\frac{4 * \sum_{n=1}^{R/t} \sqrt[2]{(Rw^2 - n^2 t^2)}}{\pi * Rw^2}$$

Our Criterion for feasibility which is self-imposed is that λ has to be higher than 1.25. That is the area obtained by longitudinal slicing that has to be 1.25 times the area obtained by the transverse traditional slicing of the ingot. Thus, required feasibility λ>1.25

Due to increase in the area of the wafers, Number of Dies Φ also increases by 1.2 times than conventional slicing.

Figure 3:
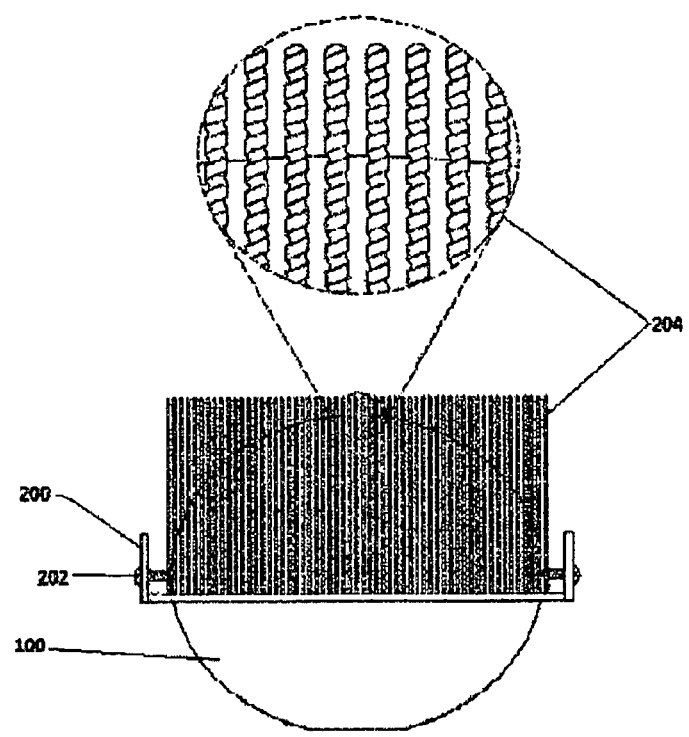
FIG. 3 exemplarily illustrates side view of one embodiment of JIG fixture assembled on ingot with zoomed section view of parallel bars.

Now referring to FIG. 3, which illustrates side view of one embodiment of JIG fixture 200 assembled on ingot 100 to hold the ingot 100 and also to guide the movement of the diamond embedded wires during slicing of ingot. According to present embodiment the JIG 200 comprises of a fixture screw 202 to fix, loose it tight the JIG over the ingot. The JIG 200 of present embodiment further comprises a plurality of parallel rods 204 to align and guide the cutting wires and also to hold the wires from sliding down during the longitudinal slicing of silicon ingot.

Figure 4:
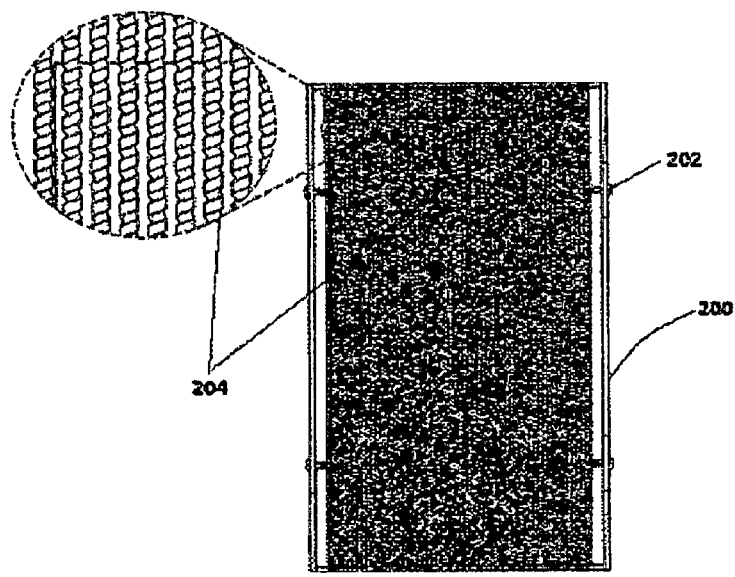
FIG. 4 exemplarily illustrates one embodiment of top view of JIG on ingot with zoomed section view of parallel bars.
Figure 5:
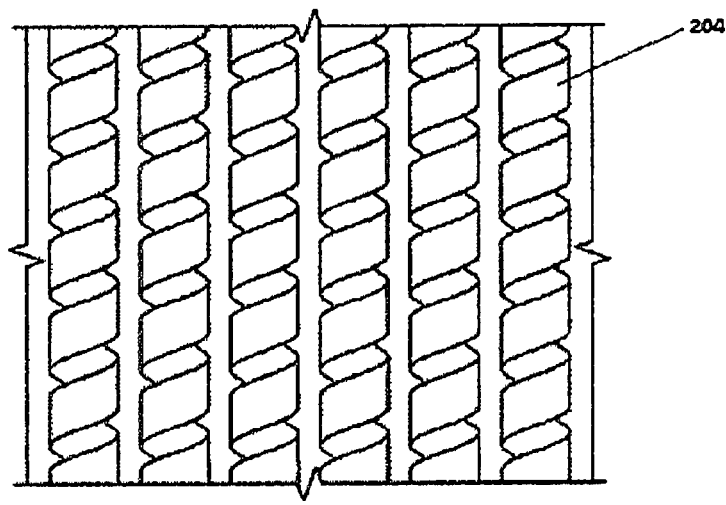
FIG. 5 exemplarily illustrates detailed or zoomed view of parallel rods with relief for debris removal from slurry slicing operation.

FIG. 4 exemplarily illustrates top view of JIG 200 on ingot 100 with zoomed section view of parallel bars. While the FIG. 5 exemplarily illustrates detailed or zoomed view of parallel rods wherein the rods are designed with relief for debris removal from slurry slicing operation.

Figure 6:
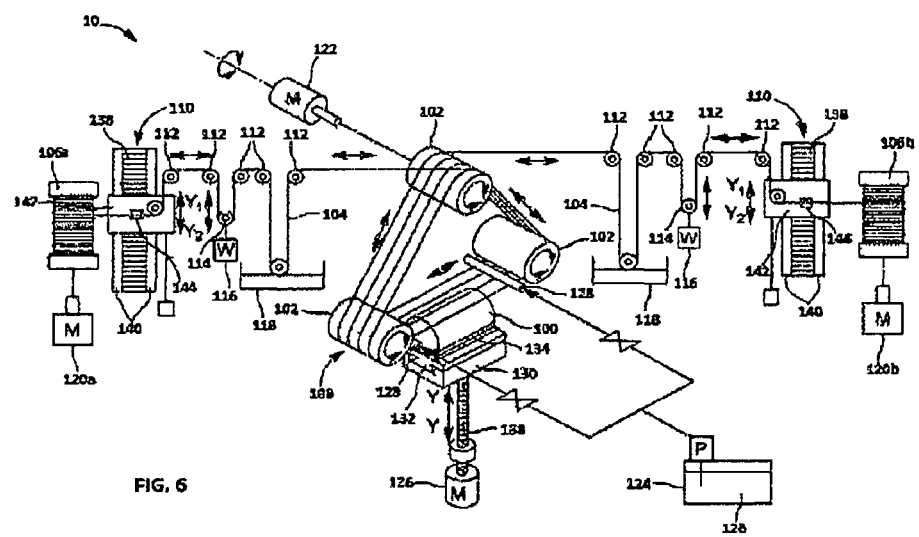
FIG. 6 illustrates one embodiment of whole structure of wire saw slicing cylindrical ingot longitudinally.

Now, referring to FIG. 6 that exemplarily illustrates whole view of one embodiment of a wire saw 10 for longitudinal slicing of cylindrical ingot. The wire saw 10 according to present invention is comprising of a wire 104, which is wounded around one wire reel 106a and also wounded around three grooved rollers 102 to form a wire raw 108 via a wire traverse apparatuses 110, fixed guide rollers 112 and a dancer roller 114. The wire 104 is then wound up by the other wire reel 106b via the fixed guide rollers 112, the dance roller 114 and the wire traverse apparatus 110 at the opposite end. According to present invention, the wire saw 10 of present invention further comprises a weight 116 of a predetermined weight which is hanged from the dancing roller 114 and configured to apply a predetermined tension to the running wire 104 permanently.

According to present embodiment, the wire saw 10 of present invention further comprises a wire cleansing apparatuses 118 configured at half way on the wire running path to remove a processing solution 126 adhered to the wire 104. The wire reels 106a and 106b connects respectively to a driving motors 120a and 120b, which are capable of rotating in forward and backward directions. Further, one of the three grooved rollers 102 connects to a driving motor 122, which is capable of rotating in both forward and backward directions. If the driving motors 120a, 120b and 122 are driven, the wire 104 runs back and forth between one wire reel 106a and other wire reel 106b. The wire row 108 is supplied with the processing solution 126, which is stored in a processing solution storage tank 124, by a wheel solution supplying nozzle 128. The cylindrical semiconductor ingot 100, which is to be processed, is supported by a work feed table 130 below the wire row 108 via an ingot mounting block 132 and a slice base mounting beam 134.

According to present embodiment, the work feed table 130 is driven by a ball screw 138, which is rotated by a motor 136, to move up and down freely. The work feed table 130 is moved up so that the cylindrical semiconductor ingot 100 can be abutted against the wire row 108, which is running at a high speed. The cylindrical semiconductor ingot 100, which is abutted against the wire row 108, is sliced into a large number of wafers by a lapping operation of the processing solution 126.

According to one embodiment, the wire traverse apparatuses 110 is provided near one wire reel 106a and the other wire reel 106b. Because these two wire traverse apparatuses 110 are constructed in the same manner, the wire traverse apparatus 110 near the wire reel 106b is only explained at present. A linear motor of the wire traverse apparatus 110 is arranged parallel to the left side of the wire reel 106b. Guide rails 140 are provided at both sides of a stator 138 of the linear motor. A slider 142 is supported by the guide rails 140 in such a manner to move freely in the direction of an arrow Y-Y. Then, the exciting current is sent into a coil of the slider 142, so that the slider 142 can move in the direction of the arrow Y-Y, along the guide rails 140. The wire traverse apparatus 106b is provided with a guide roller 144, a load cell (not shown), and a control part (not shown). The guide roller 144 is arranged on the left side of the wire reel 106b, and an axis of the guide roller 144 is arranged parallel to that of the wire reel 106b. The guide roller 144 is rotatably supported by the right end of a load cell. A groove is formed at the outer circumference of the guide roller 144, and the wire 104 is wound around the groove in the direction of the arrow.

According to one embodiment, this method and apparatus of longitudinal slicing of cylindrical ingot further increases the number of chips, if the diameter of ingot is increased. The actual number of chip increase, by manipulation of diameter of the ingot is governed by the formula:

$$\frac{4 * \sum_{n=1}^{R/t} \sqrt[2]{(Rw^2 - n^2t^2)}}{\pi * Rw^2}$$

Figure 8:
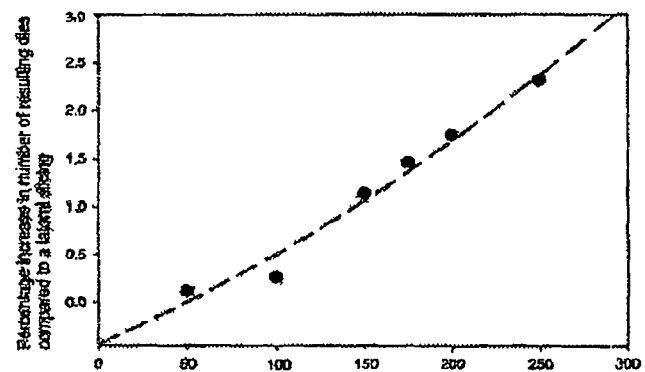
FIG. 8 illustrates a graph showing a percentage increase of dies in lateral slicing.
Figure 9:
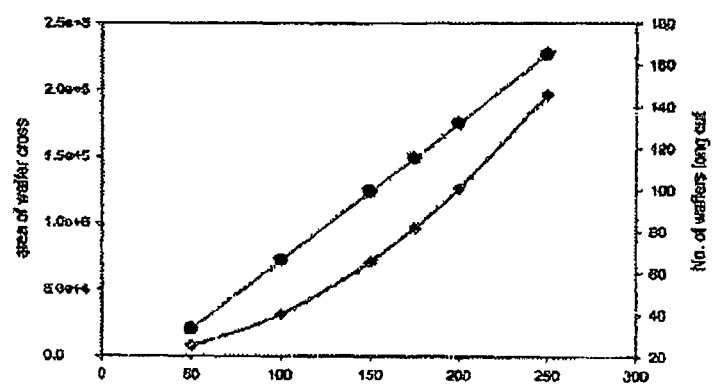
FIG. 9 illustrates a graph showing a number of wafer cut longitudinally.

According to yet another embodiment, the advantages of this method and apparatus of longitudinal slicing of a cylindrical ingot increases the number of resulting chips, applies to any diameter of an ingot and whether the diameter is increased or decreased. Thus, regardless of the diameter>the actual number of chips would increase, compared to an ingot of the same diameter sliced laterally (i.e., perpendicular to the longest axis). The process is governed by the same formulas described earlier. The results are graphically illustrated in FIGS. 8 and 9.

According to the figure the number of the resulting wafers and consequently the number of the dies in addition to the increase in chips per ingot is a function of the diameter of the ingot. This in turn is a function of the crucible used to grow the crystals using a CZ foundry method.

The reference of "Daggolu, P., Ryu, J., Galyukov A., & Kondratyev A. (2016). Analysis of the effective of symmetric/asymmetric CUSP magnetic fields on melt/crystal interface during Czochralski silicon growth" and "Kamiyama, E., Abe, Y., Banba, H., Saito, H., Maeda, S., Kuliev, A., Iizuka, M., Mukaiyama, Y., & Sueoka, K. (2016). Impact of Anisotropic Thermal Stress on Behavior of Grown-In Defects during Si Crystal Growth from a Melt" was taken during cylindrical ingot manufacturing.

According to one embodiment, the cylindrical ingot slicing is done at least 5 degree angle or more from the longitudinal axis of the cylindrical ingot to produce a non-circular wafers. Also, the cylindrical ingot slicing is not done to produce a circular wafers. Further, according to one embodiment, the cylindrical ingot slicing using the present slicing apparatus and method may be done at any angle from the longitudinal axis of the cylindrical ingot to produce a non-circular wafers.

Figure 7:
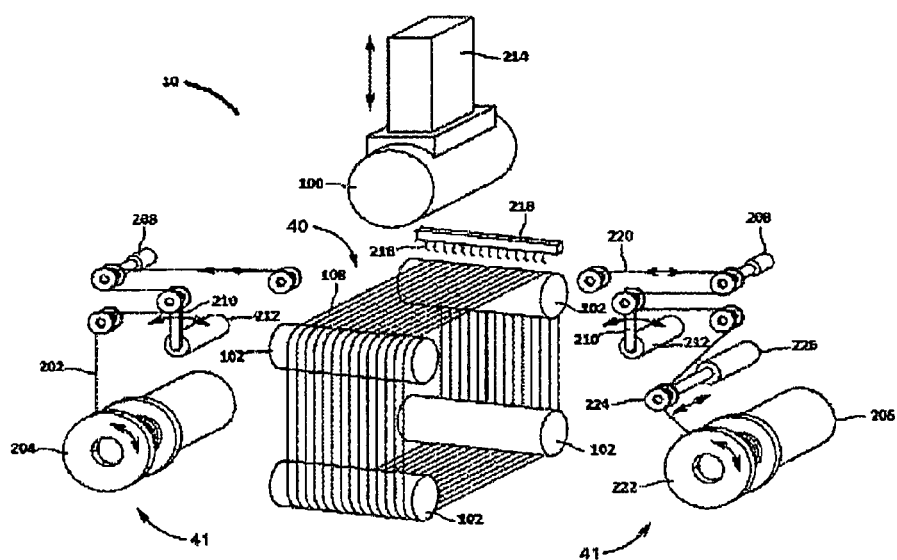
FIG. 7 illustrates one another embodiment of wire saw slicing the cylindrical ingot longitudinally.

Referring to FIG. 7 now which discloses one another embodiment of wire saw 20 for slicing the cylindrical ingot 100 longitudinally. According to this embodiment, the new wire 202 leaves a supply bobbin 204 which is driven by a rotor 206. The wire saw 20 of present embodiment further comprises a tension measure 208 that is configured to correct a tensioning arm 210 coupled to a motor 212. The wire 202 then passes into the sawing region 40, about wire guide 102 to form the sheet of wires 108. The cylindrical silicon ingot 100 to be sawed, fixed to a support table 214, comes to bear against the letter to be sawed by the abrasive 216 from a distributor 218 and entrained by the wires of the layer 108. The used wire 220 leaves the layer 108 and returns to the wind-up spool 222 by means of the tensioning arm 210, the tension measuring arm 208 and the traversing pulley 224 actuated with lateral reciprocal movement by the motor 226. The management device 41 of the wire thus comprises spools 204 and 222 mounted rotatably about their axes.

The foregoing disclosure is not intended to limit the present disclosure to the precise form or particular field of use disclosed. As such, it is contemplated that various alternate embodiments and/or modifications to the present disclosure, whether explicitly described or implied herein, are possible in light of the disclosure. Having thus described embodiments of the present disclosure, person of ordinary skill in the art will recognize that changes may be made in the form and details without departing from the scope of the present disclosure is limited only by the claims

The invention claimed is:

1. An apparatus for longitudinal slicing of a cylindrical ingot to maximize chip yield, comprising: a wire wounded around at least one wire reel and a plurality of grooved rollers to form a wire row of parallel wires via at least one wire traverse apparatus, a first plurality of fixed guide rollers and at least one first dancer roller at one end of the plurality of grooved rollers; the wire is then wounded up by at least one another wire reel via a second plurality of fixed guide rollers, at least one second dancing roller and at least one another wire traverse apparatus at opposite end of the plurality of grooved rollers; a plurality of driving motors connected to both the wire reels and configured to rotate the wire reels in a forward and backward directions; at least one driving motor connected to at least one of the plurality of grooved rollers which is capable of rotating in a forward and backward directions; a JIG fixture for fixing a JIG over the cylindrical ingot to hold the cylindrical ingot during slicing; wherein the JIG further comprises a plurality of parallel bars to engage and hold the wire row of parallel wires at desired location on a curve surface of the cylindrical ingot while longitudinal slicing for production of a rectangular shaped semiconductor wafers; wherein the JIG with plurality of parallel bars is attached at ends along a longitudinal axis of the cylindrical ingot; wherein each parallel wire of the wire row sets between two consecutive bars of the plurality of parallel bars which prevents displacements of the parallel wires of the wire row during slicing of the cylindrical ingot on the curved surface: wherein the plurality of parallel bars are designed with a relief for removal of a cutting debris and fluid during the slicing of the cylindrical ingot; wherein the wire row longitudinally slices the cylindrical ingot resulting in rectangular wafers maximizing chip yield; wherein the cylindrical ingot is configured such that a longest axis of the cylindrical ingot comes parallel to the running direction of the wires slicing the cylindrical ingot into the rectangular wafers; and a work feed table is configured to support the cylindrical ingot via an ingot mounting block and a slice base mounting beam.

2. The apparatus for longitudinal slicing of the cylindrical ingot of claim 1, wherein when the driving motors connected to both the wire reels and at least one of the plurality of grooved rollers is driven, the wire runs back and forth between the wire reels of either ends of the plurality of grooved rollers to slice the cylindrical ingot.

3. The apparatus for longitudinal slicing of the cylindrical ingot of claim 1, wherein the work feed table is driven by a ball screw which is rotated by a motor to move up and down for abutment of the cylindrical ingot against the wire row.

4. The apparatus for longitudinal slicing of the cylindrical ingot of claim 1, wherein the wire traverse apparatus is further comprised of a linear motor having a pair of guide rails at both the sides of a stator, a slider supported by the guide rails, a load cell and a control part.

5. The apparatus for longitudinal slicing of the cylindrical ingot of claim 1 is further comprised of a weight hanged from the dancing roller and configured to apply a tension to the wire.

6. The apparatus for longitudinal slicing of the cylindrical ingot of claim 1 is further comprised of a processing solution stored in a storage tank which is supplied to the wire row by a wheel solution supplying nozzle during slicing of the cylindrical ingot.

\* \* \* \* \*